(12) United States Patent
Nagai

(10) Patent No.: US 7,662,733 B2
(45) Date of Patent: Feb. 16, 2010

(54) VAPOR PHASE GROWTH APPARATUS

(75) Inventor: Hisataka Nagai, Hitachi (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 2 days.

(21) Appl. No.: 12/318,104

(22) Filed: Dec. 22, 2008

(65) Prior Publication Data

US 2009/0117721 A1  May 7, 2009

Related U.S. Application Data

(62) Division of application No. 11/070,162, filed on Mar. 3, 2005, now Pat. No. 7,494,562.

(30) Foreign Application Priority Data

Oct. 12, 2004 (JP) .............................. 2004-297504

(51) Int. Cl.
*H01L 21/02* (2006.01)
(52) U.S. Cl. .................. 438/800; 156/345.55; 118/730; 257/E21.002
(58) Field of Classification Search .................. 118/730; 156/345.55; 438/800
See application file for complete search history.

(56) References Cited

U.S. PATENT DOCUMENTS 6,164,844 A * 12/2000 Okumura et al. ............ 396/447
6,465,043 B1   10/2002 Gupta
2002/0083899 A1 * 7/2002 Komeno et al. ............. 118/730

FOREIGN PATENT DOCUMENTS

| JP | 09-162128 | 6/1997 |
| JP | 10-219447 | 8/1998 |
| JP | 2002-175992 | 6/2002 |
| JP | 2003-347228 | 12/2003 |

OTHER PUBLICATIONS

Japanese Office Action dated Mar. 31, 2009 with English Translation.

* cited by examiner

*Primary Examiner*—W. David Coleman
*Assistant Examiner*—Daniel Shook
(74) *Attorney, Agent, or Firm*—McGinn IP Law Group, PLLC

(57) ABSTRACT

A method of cooling a complex electronic system includes preventing system air from passing through a front side and a rear side of a server system main board, organizing a plurality of electronic segments of the server system main board, providing cool air horizontally to the server system main board through a cool air intake provided at a position located underneath the front side and at a bottom side of the server system main board, using the cool air intake to provide the cool air to a plurality of cooling segments that redirect the cool air vertically at a 90° angle, and using a hot air exhaust after the hot air reaches the top side of the server system main board to redirect the hot air horizontally at a 90° angle and exhaust the hot air.

3 Claims, 5 Drawing Sheets

VAPOR PHASE GROWTH APPARATUS

CROSS-REFERENCE TO RELATED APPLICATIONS

The present application is a Divisional application of U.S. patent application Ser. No. 11/070,162 filed on Mar. 3, 2005 now U.S. Pat. No. 7,494,562. The present Application is based on and claims priority to Japanese patent application No. 2004-297504 filed on Mar. 4, 2004, the entire contents of which are incorporated herein by reference.

BACKGROUND OF THE INVENTION

1. Field of the Invention

This invention relates to a vapor phase growth apparatus that a source gas is flown onto a semiconductor wafer held by a susceptor so as to grow a semiconductor crystal thin film (epitaxial layer) on the surface of the semiconductor wafer, and particularly to a planetarium type vapor phase growth apparatus that the susceptor rotates on its axis and revolves around an axis (in a certain orbit).

2. Description of the Related Art

A vapor phase growth method is one of methods for growing a semiconductor crystal. In the vapor phase growth method, a source gas is flown onto the surface of a heated semiconductor wafer, and thereby a semiconductor crystal thin film is grown on the surface of the semiconductor wafer. This method is characterized by that an ultra-thin film as thin as several nanometers can be grown since it uses gas as a raw material. Further, the method has a good mass productivity since it uses high-purity organic metal/hydride/carrier gas and it needs no ultrahigh vacuum required of the molecular beam epitaxy.

One of vapor phase growth apparatuses used for the vapor phase growth method is a planetarium type vapor phase growth apparatus that the susceptor rotates on its axis and revolves around an axis (in a certain orbit). The planetarium type vapor phase growth apparatus is characterized by that it has a good uniformity in the thickness of grown film.

FIG. 1 is a schematic cross sectional view showing a conventional planetarium type vapor phase growth apparatus 101.

The vapor phase growth apparatus 101 is structured such that a source gas 103 is introduced into the apparatus from the bottom through a source gas inlet 102 that opens downward. The source gas 103 is thermally decomposed in the apparatus. An exhaust gas 104 thermally decomposed is, in the horizontal direction, discharged radially from the center of the apparatus through a plurality of (e.g., six) gas exhausts 105 which are provided on the sidewall of the apparatus.

In the apparatus, there are provided rotation susceptors 107 to hold a semiconductor wafer 106, a revolution susceptor 108 (for moving the rotation susceptors 107 in orbit motion) and a heater 109 to heat the semiconductor wafer 106. The revolution susceptor 108 is connected to a shaft 111 of a motor 110 at the center thereof such that it is rotated by the driving force of the motor 110. The semiconductor wafer 106, which has a front surface and a back surface, is held by the rotation susceptor 107 while keeping the front surface downward. The rotation susceptor 107 is rotatably mounted on the revolution susceptor 108 through bearings 112.

FIG. 2 is an enlarged cross sectional view showing circled part C in FIG. 1.

The rotation susceptor 107 and the revolution susceptor 108 each are provided with a groove for placing the bearing 112 therein on the opposed surfaces. The bearing 112 is placed between the grooves. The rotation susceptor 107, which is rotatably mounted on the revolution susceptor 108 through the bearing 112, is integrally provided with a pinion gear 113 that protrudes sideward from the position of the bearing 112 and the groove for placing the bearing 112 therein. On the other hand, corresponding to the pinion gear 113, an internal gear 114 is provided on the inner wall of the vapor phase growth apparatus 101 such that the pinion gear 113 meshes with the internal gear 114. 115 is a gear mesh portion where the pinion gear 113 meshes with the internal gear 114. FIG. 4 shows the enlarged gear mesh portion 115 in top view.

FIG. 3 is a top view showing the positional relationship among the internal gear 114 on the inner wall of the vapor phase growth apparatus 101, the rotation susceptor 107 and the revolution susceptor 108. Meanwhile, since FIG. 1 is illustrated schematically, the dimensions of parts in FIG. 1 are not always identical with those in FIG. 3.

As shown in FIG. 3, the vapor phase growth apparatus 101 is provided with the twelve rotation susceptors 107 which are annually disposed on the periphery of revolution susceptor 108 which is formed like a large disk. The rotation susceptors 107 each are provided with six claws 116 by which the semiconductor 106 is held.

In operation, when the revolution susceptor 108 is rotated by the motor 110, the rotation susceptors 107 are also rotated around the center axis of the revolution susceptor 108. Simultaneously, since each of the rotation susceptors 107 also meshes with the internal gear 114, it rotates on its center axis. Thus, the semiconductor wafer 106 being held by the rotation susceptor 107 is allowed to rotate on its center axis while rotating around the center axis of the revolution susceptor 108. In this state, the source gas 103 is introduced through the source gas inlet 102 as shown in FIG. 1, and then it is thermally decomposed on the surface of the semiconductor wafer 106 being heated by the heater 109 such that a semiconductor crystal thin film is grown on the surface of the semiconductor wafer 106. Thus, since the semiconductor wafer 106 rotates on its center axis while rotating around the center axis of the revolution susceptor 108, the high uniformity semiconductor crystal thin film can be grown on the surface of the semiconductor wafer 106.

Japanese patent application laid-open No. 10-219447 discloses an example of the conventional planetarium type vapor phase growth apparatus, though this apparatus is not directly relevant to this invention.

The conventional planetarium type vapor phase growth apparatus as shown in FIGS. 1 to 4 has a problem as mentioned below.

The conventional vapor phase growth apparatus 101 is structured such that the pinion gear 113 integrated with the rotation susceptor 107 to hold the semiconductor wafer 106 is located laterally from the position of the bearing 112 and the groove for placing the bearing 112 therein. Therefore, the diameter of the rotation susceptor 107 is unnecessarily larger than that of the semiconductor wafer 106. Referring to FIG. 3, provided that the semiconductor wafer 106 with a diameter of 76 mm is held by the rotation susceptor 107, the number of the rotation susceptors 107 allocable on the periphery of the revolution susceptor 108 is limited to twelve in view of the positional relationship with the internal gear 114. However, if the number of the rotation susceptors 107 allocable on the revolution susceptor 108 increases, the number of semiconductor wafers, with a semiconductor crystal thin film formed thereon, fabricable by the one vapor phase growth apparatus 101 in one manufacture process increases. Thus, it is desired to increase the number of the rotation susceptors allocable on the periphery of the revolution susceptor to improve the productivity of the vapor phase growth apparatus.

SUMMARY OF THE INVENTION

It is an object of the invention to provide a vapor phase growth apparatus that the number of the rotation susceptors allocable on the periphery of the revolution susceptor is increased to enhance the productivity.

(1) According to one aspect of the invention, a vapor phase growth apparatus comprises:

a source gas inlet;

a heater to heat a semiconductor wafer;

a gas exhaust;

a plurality of rotation susceptors to hold the semiconductor wafer;

a disk-like revolution susceptor on which the plurality of rotation susceptors are rotatably mounted through a bearing;

wherein the plurality of rotation susceptors are annually disposed on the periphery of the revolution susceptor, the plurality of rotation susceptors each are, on its periphery, provided with a pinion gear that meshes with a common internal gear that is located outside of the revolution susceptor, and the pinion gear provided on the plurality of rotation susceptors is located directly above the bearing.

(2) According to another aspect of the invention, a vapor phase growth apparatus comprises:

a source gas inlet;

a heater to heat a semiconductor wafer;

a gas exhaust;

a plurality of rotation susceptors to hold the semiconductor wafer;

a disk-like revolution susceptor on which the plurality of rotation susceptors are rotatably mounted through a bearing;

wherein the plurality of rotation susceptors are annually disposed on the periphery of the revolution susceptor, the plurality of rotation susceptors each are, on its periphery, provided with a pinion gear that meshes with a common external gear that is located inside of the revolution susceptor, and the pinion gear provided on the plurality of rotation susceptors is located directly above the bearing.

It is preferred that the plurality of rotation susceptors each comprise an outermost end that is substantially aligned with an outermost end of the revolution susceptor.

Further, it is preferred that the source gas inlet opens downward such that a source gas is introduced from the bottom of the apparatus toward the center of the revolution susceptor, and a plurality of the gas exhausts are disposed on the side of the apparatus such that an exhaust gas is discharged laterally and radially from the center of the revolution susceptor through the gas exhausts.

Further, it is preferred that the plurality of rotation susceptors are allowed to hold the semiconductor wafer while keeping a front surface of the semiconductor wafer-downward.

(3) According to another aspect of the invention, a vapor phase growth apparatus comprises:

a source gas inlet;

a heater to heat a semiconductor wafer;

a gas exhaust;

a plurality of rotation susceptors to hold the semiconductor wafer;

a disk-like revolution susceptor on which the plurality of rotation susceptors are rotatably mounted through a bearing;

wherein the plurality of rotation susceptors are annually disposed on the periphery of the revolution susceptor, the plurality of rotation susceptors each are, on its periphery, provided with a pinion gear that meshes with a common gear that allows each of the plurality of rotation susceptors to rotate on its center axis, and the plurality of rotation susceptors each comprise an outermost end that is substantially aligned with an outermost end of the revolution susceptor.

It is preferred that the pinion gear provided on the plurality of rotation susceptors is located directly above the bearing.

<Advantages of the Invention>

In the invention, the vapor phase growth apparatus is composed such that the pinion gear provided on the rotation susceptor, which is rotatably mounted through the bearing on the revolution susceptor, is located directly above the bearing instead of protruding laterally and outward from the periphery of the rotation susceptor. Therefore, the diameter of the rotation susceptor can be reduced by that much. Thereby, the number of the rotation susceptors mounted on the revolution susceptor can be increased. As a result, the number of semiconductor wafers with a semiconductor crystal thin film grown thereon fabricable in one manufacture process can be increased. Hence, the productivity of the vapor phase growth apparatus can be significantly enhanced.

BRIEF DESCRIPTION OF THE DRAWINGS

The preferred embodiments according to the invention will be explained below referring, to the drawings, wherein.

DETAILED DESCRIPTION OF THE PREFERRED EMBODIMENTS

First Embodiment

Figure 5:
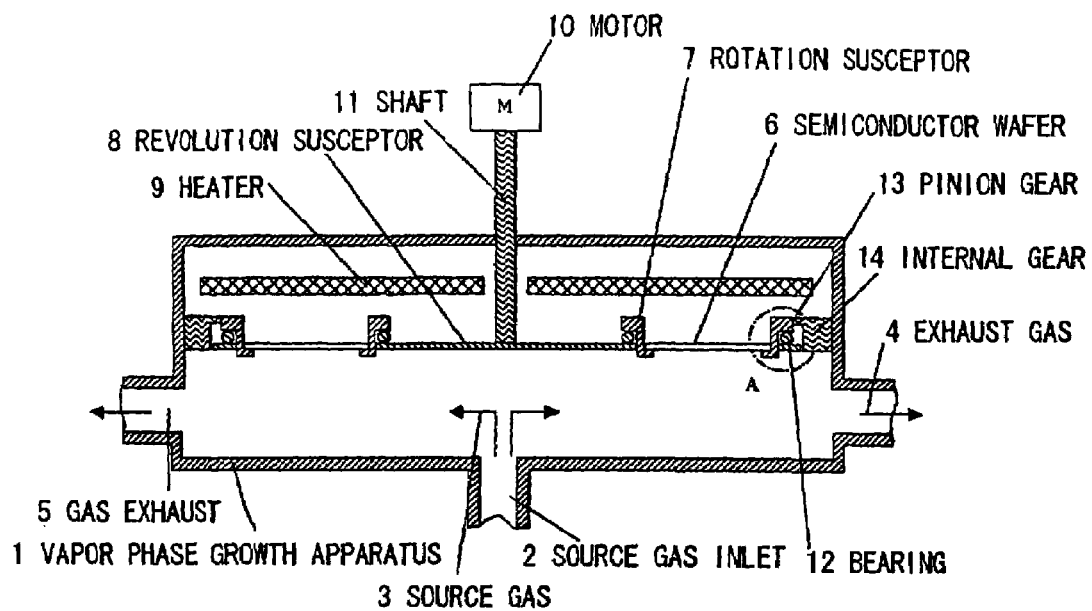
FIG. 5 is a schematic cross sectional view showing a vapor phase growth apparatus in a first preferred embodiment according to the invention.

FIG. 5 is a schematic cross sectional view showing a vapor phase growth apparatus 1 in the first preferred embodiment according to the invention.

The vapor phase growth apparatus 1 is at its bottom provided with a source gas inlet 2 through which that a source gas 3 is introduced into the apparatus from the bottom toward the center of a disk-like revolution susceptor 8. Also, it is on its sidewall provided with a plurality of gas exhausts 5 through which an exhaust gas 4 is discharged laterally and radially from the center of the disk-like revolution susceptor 8.

Fourteen semiconductor wafers 6 with a diameter of 76 mm are held by the rotation susceptor 7 while keeping its front surface downward on the same surface as the revolution susceptor 8. The semiconductor wafer 6 on the rotation susceptor 7 is heated by a heater 9, and the source gas is thermally decomposed on the surface of the heated semiconductor wafer 6 to allow the crystal growth thereon.

Figure 8:
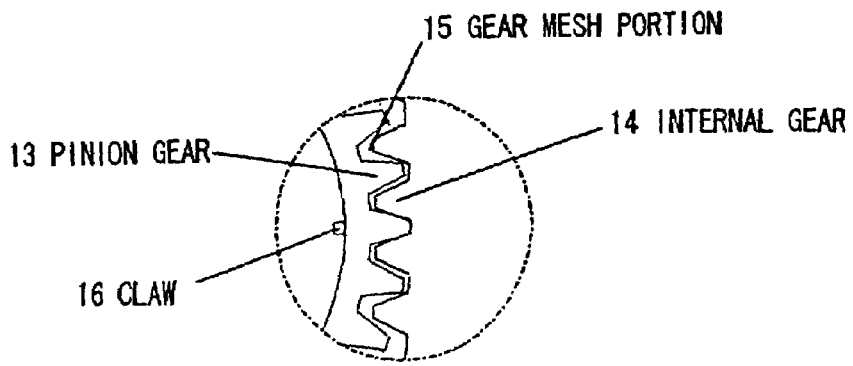
FIG. 8 is an enlarged top view showing circled part B in FIG. 7.

The rotation susceptor 7 is rotatably mounted through bearings 12 on the revolution susceptor 8. The rotation susceptor 7 is provided with a pinion gear 13 integrally formed on the periphery thereof. A common internal gear 14 which is placed outside the pinion gear 13 is integrally formed on the inner wall of the vapor phase growth apparatus 1. The pinion gear 13 meshes with the internal gear 14 as shown in FIG. 8.

The revolution susceptor 8 is connected to a shaft 11 of a motor 10 at its center such that it is rotated by the driving force of the motor 10. As mentioned above, since the pinion gear 13 of the susceptor 7 meshes with the internal gear 14, when the revolution susceptor 8 is rotated by the motor 10, the rotation susceptor 7 rotates on its center axis and rotates around the center axis of the revolution susceptor 8.

Figure 1:
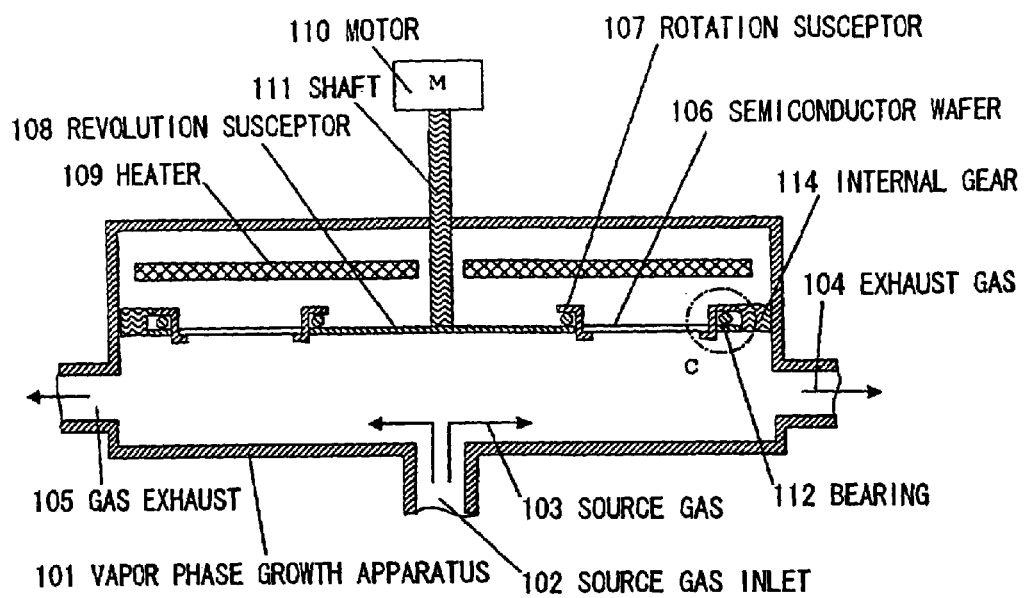
FIG. 1 is a schematic cross sectional view showing the conventional planetarium type vapor phase growth apparatus.
Figure 2:
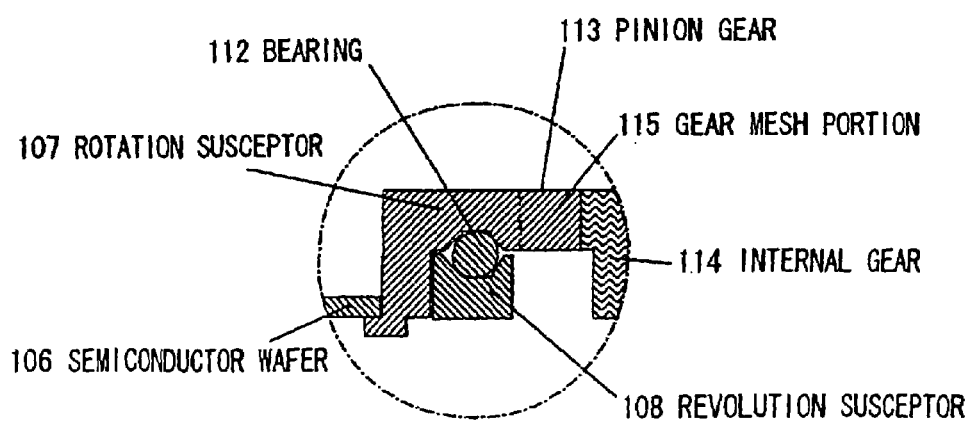
FIG. 2 is an enlarged cross sectional view showing circled part C in FIG. 1.
Figure 3:
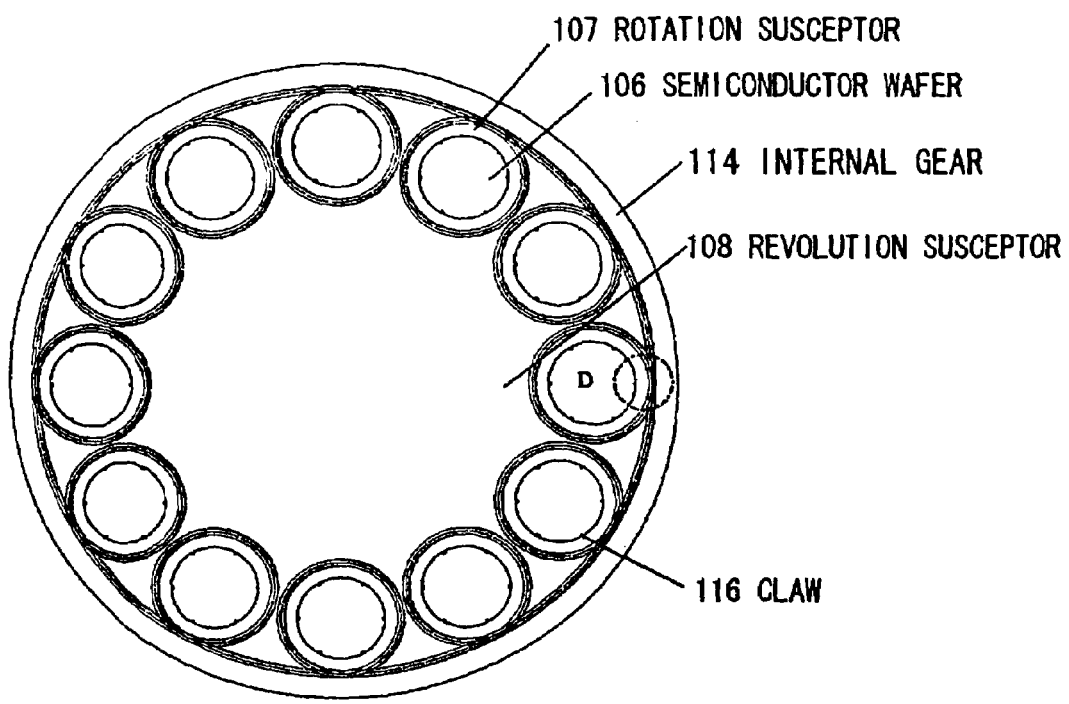
FIG. 3 is a top view showing the positional relationship among a revolution susceptor, a rotation susceptor and an internal gear in FIG. 1.
Figure 4:
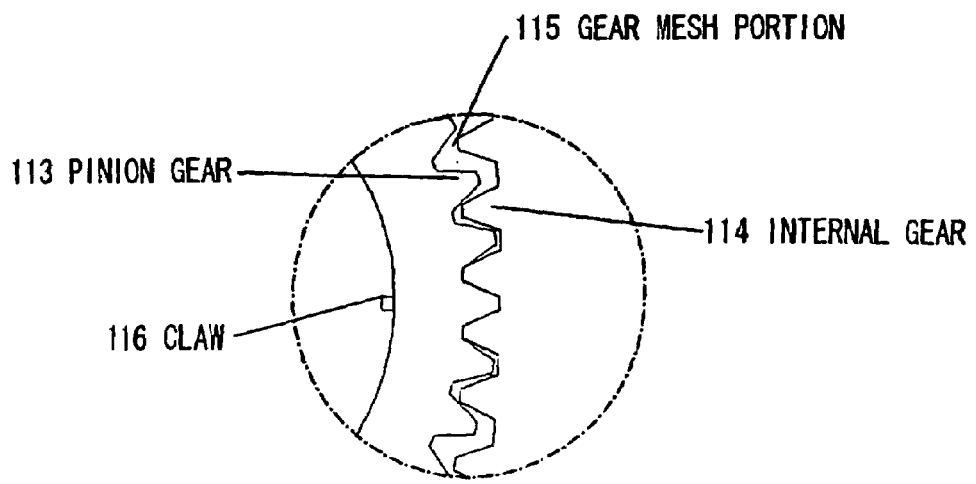
FIG. 4 is an enlarged top view showing circled part D in FIG. 3.
Figure 6:
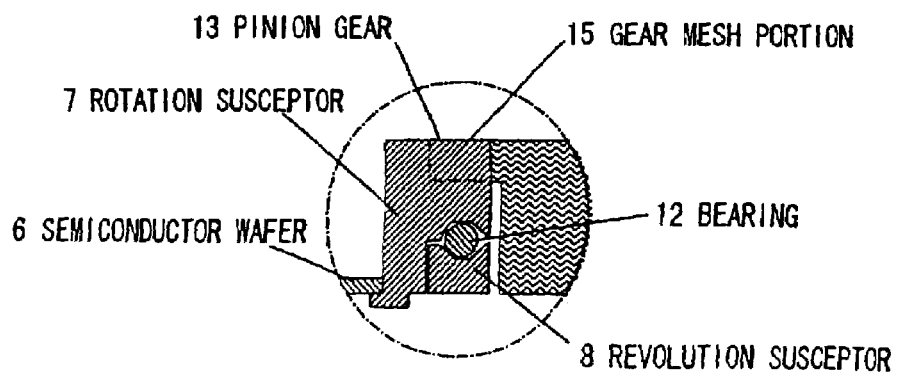
FIG. 6 is an enlarged cross sectional view showing circled part A in FIG. 5.
Figure 7:
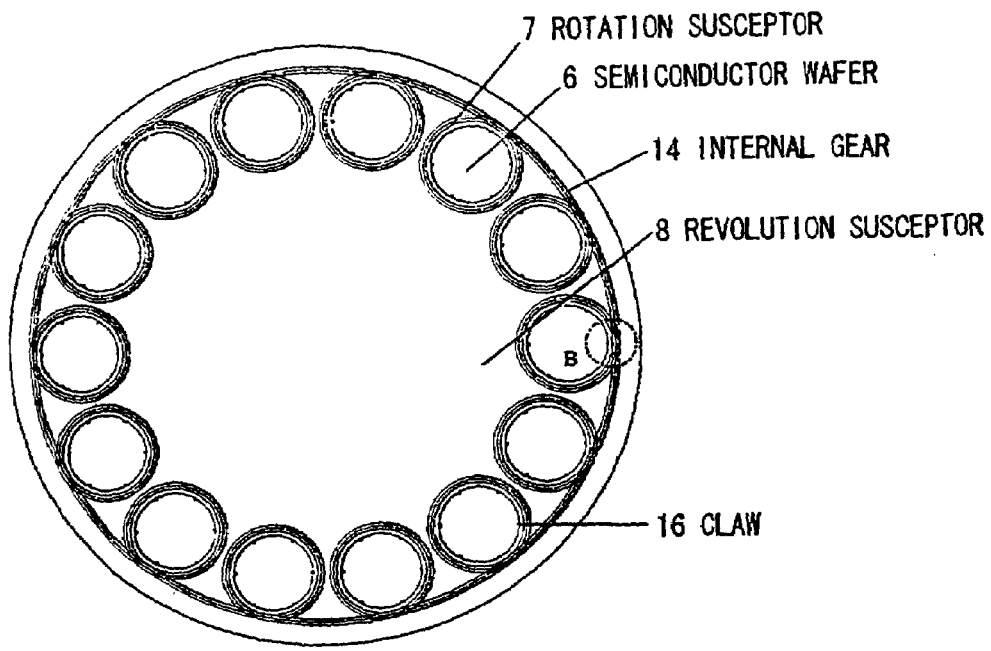
FIG. 7 is a top view showing the positional relationship among a revolution susceptor, a rotation susceptor and an internal gear in FIG. 5.

In this embodiment, the pinion gear 13, which is integrally formed on the periphery of the rotation susceptor 7, is made to be located directly above the bearing 12 as shown in FIG. 6 instead of protruding laterally and outward from the periphery of the rotation susceptor 7. Thus, by changing the formation position of the pinion gear 13, the size (diameter) of the rotation susceptor 7 can be one size smaller than that in the conventional apparatus as shown in FIG. 3. As a result, although the twelve semiconductor wafers of 76 mm diameter are placed on the periphery of the revolution susceptor in the conventional apparatus as shown in FIG. 3, in this embodiment the fourteen semiconductor wafers can be placed thereon. In this case, due to the increase of semiconductor wafers, the productivity of the semiconductor wafer can be enhanced about 17%. Meanwhile, although the conventional rotation susceptor as shown in FIG. 3 has a diameter of 111 mm, the rotation susceptor 3 of this embodiment as shown in FIG. 7 has a diameter of 99 mm. Such an effect obtained by the reduction of diameter in the rotation susceptor can be enhanced as the diameter of the revolution susceptor increases.

Second Embodiment

Figure 9:
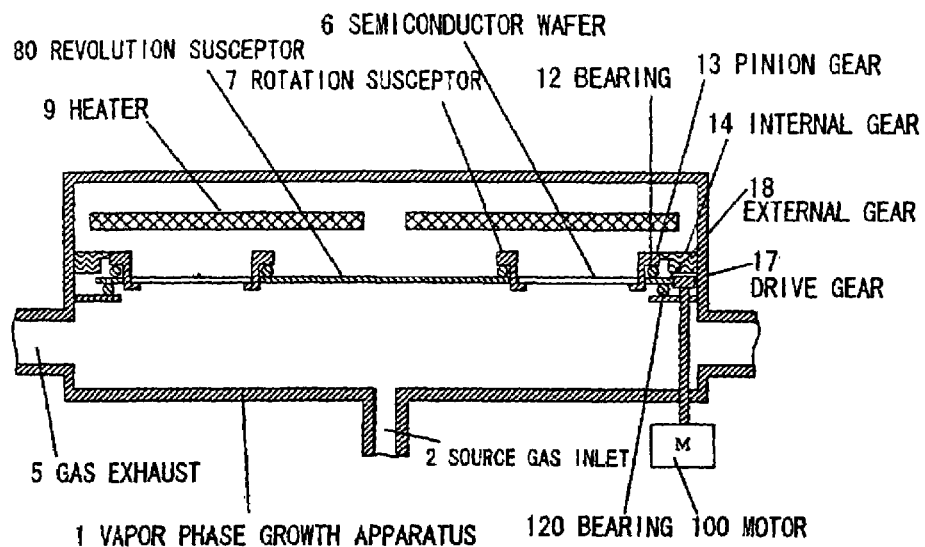
FIG. 9 is a schematic cross sectional view showing a vapor phase growth apparatus in a second preferred embodiment according to the invention.

FIG. 9 is a schematic cross sectional view showing a vapor phase growth apparatus in the second preferred embodiment according to the invention. In FIG. 9, like components are indicated by the same numerals as used in FIG. 5.

Although the vapor phase growth apparatus 1 in FIG. 5 is the shaft 11 of the motor 10 is connected to the center of the revolution susceptor 8 so as to rotate the revolution susceptor 8, in the second embodiment a revolution susceptor 80 is provided with an external gear 18 on its periphery. The external gear 18 meshes with a drive gear 17 that is connected to the shaft of a motor 100, and the revolution susceptor is rotated by the driving force of the motor 100.

Also in the second embodiment, the pinion gear 13, which is integrally formed on the periphery of the rotation susceptor 7, is made to be located directly above the bearing 12 as shown in FIG. 6 instead of protruding laterally and outward from the periphery of the rotation susceptor 7.

Therefore, the same effect as obtained in the first embodiment can be obtained in the second embodiment.

Third Embodiment

Figure 10:
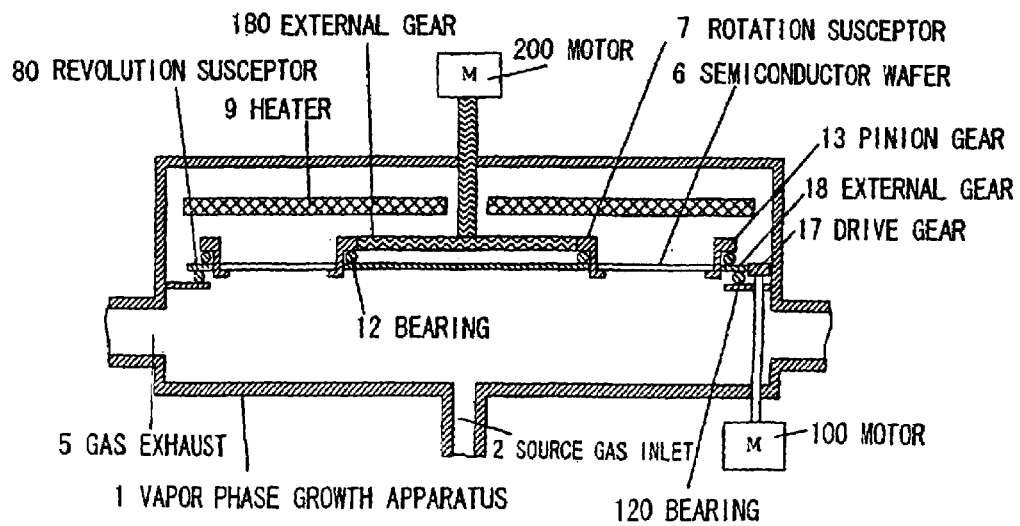
FIG. 10 is a schematic cross sectional view showing a vapor phase growth apparatus in a third preferred embodiment according to the invention.

FIG. 10 is a schematic cross sectional view showing a vapor phase growth apparatus in the third preferred embodiment according to the invention. In FIG. 10, like components are indicated by the same numerals as used in FIG. 5 and FIG. 9.

In the third embodiment, the vapor phase growth apparatus 1 is provided with an external gear 180, which is connected to the shaft of a motor 200, to mesh with the pinion 13 of the rotation susceptor, while the internal gear 14 integrally formed on the inner wall of the apparatus 1 is removed.

In operation, the revolution susceptor 80 is rotated by the driving force of the motor 100 since the external gear 18 of the revolution susceptor 80 meshes with the drive gear 17 of the motor 100. The rotation susceptor 7 is rotated by the driving force of the motor 200 since the pinion gear 13 of the rotation susceptor 7 meshes with the external gear 180 of the motor 200.

Also in the third embodiment, the pinion gear 13, which is integrally formed on the periphery of the rotation susceptor 7, is made to be located directly above the bearing 12 as shown in FIG. 6 instead of protruding laterally and outward from the periphery of the rotation susceptor 7.

Therefore, the same effect as obtained in the first embodiment can be obtained in the third embodiment.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

The invention claimed is:

1. A vapor phase growth process comprising:
   heating semiconductor wafers, the semiconductor wafers being heated by a heater mounted in a vapor phase growth apparatus; and
   thermally decomposing a source gas on the semiconductor wafers such that crystal growth occurs on the semiconductor wafers, the semiconductor wafers being held towards a bottom area of the vapor phase growth apparatus by a plurality of rotation susceptors, the plurality of rotation susceptors having bearing holding portions aligned with an outermost end of a projected portion of pinion gears that mesh with a common gear, the common gear being located at a periphery of a disk-like revolution susceptor, the pinion gears meshing with the common gear at a position directly above a bearing, the plurality of rotation susceptors being rotatably mounted through the bearing in an annular disposition on the periphery of the disk-like revolution susceptor,
   wherein an outermost end of a projected portion of said pinion gears located at an upper portion of a periphery of the plurality of rotation susceptors is substantially aligned with an outermost end of a projected portion of said common gear located at the periphery of the revolution susceptor.

2. The vapor phase growth process according to claim 1, wherein the source gas is introduced through a source gas inlet of the vapor phase growth apparatus, the source gas inlet leading the source gas to a bottom area of the vapor phase growth apparatus and toward a center area of the disk-like revolution susceptor.

3. The vapor phase growth process according to claim 1, wherein the source gas is discharged laterally and radially from a center area of the disk-line revolution susceptor and through a plurality of gas exhausts located on sidewalls of the vapor phase growth apparatus.

* * * * *